(12) United States Patent
Au et al.

(10) Patent No.: US 12,020,959 B2
(45) Date of Patent: Jun. 25, 2024

(54) DETAPE APPARATUS FOR AN OPTICAL ALIGNMENT MACHINE

(71) Applicant: ASMPT SINGAPORE PTE. LTD., Singapore (SG)

(72) Inventors: Po Lam Au, Hong Kong (HK); Chi Piu Wong, Hong Kong (HK); Kin Chiu Yip, Hong Kong (HK); Siu Yin So, Hong Kong (HK); Fan Leuk Lai, Hong Kong (HK)

(73) Assignee: ASMPT SINGAPORE PTE. LTD., Singapore (SG)

( * ) Notice: Subject to any disclaimer, the term of this patent is extended or adjusted under 35 U.S.C. 154(b) by 619 days.

(21) Appl. No.: 17/064,650

(22) Filed: Oct. 7, 2020

(65) Prior Publication Data

US 2022/0108901 A1 Apr. 7, 2022

(51) Int. Cl.
*H01L 21/00* (2006.01)
*H01L 21/67* (2006.01)
*H01L 21/68* (2006.01)

(52) U.S. Cl.
CPC ...... *H01L 21/67132* (2013.01); *H01L 21/681* (2013.01)

(58) Field of Classification Search
CPC ............. H01L 21/67132; H01L 21/681; H01L 21/67144

USPC ........ 156/765, 923, 943, 759, 760, 930, 941
See application file for complete search history.

(56) References Cited

U.S. PATENT DOCUMENTS

| | | | | |
|---|---|---|---|---|
| 5,454,900 A * | 10/1995 | Han | ....................... | B65H 41/00 156/701 |
| 6,585,471 B2 * | 7/2003 | Odajima | ........... | H01L 21/67144 156/701 |
| 8,470,131 B2 * | 6/2013 | Studt | ................. | H01L 21/67144 156/707 |
| 9,343,338 B2 * | 5/2016 | Okamoto | .......... | H01L 21/67132 |
| 9,987,838 B2 * | 6/2018 | Uemura | ............... | B23K 26/402 |

\* cited by examiner

*Primary Examiner* — Linda L Gray
(74) *Attorney, Agent, or Firm* — OSTROLENK FABER LLP

(57) ABSTRACT

A detape apparatus has a support unit with a deck surface for supporting a tape carrier. The deck surface defines a support plane on which the tape carrier is supportable, and a conveyor is configured to move the tape carrier in a conveyance direction along the deck surface. During a detape process, a receiving segment of a first urging element is movable to a first detape position next to a first side of the tape carrier, while a second urging element is movable to a second detape position abutting the tape carrier on an opposite side of the tape carrier to thereby push the tape carrier out of the support plane to separate at least one electronic component from the tape carrier. The receiving segment may then receive the at least one electric component which is thus separated from the tape carrier.

16 Claims, 17 Drawing Sheets

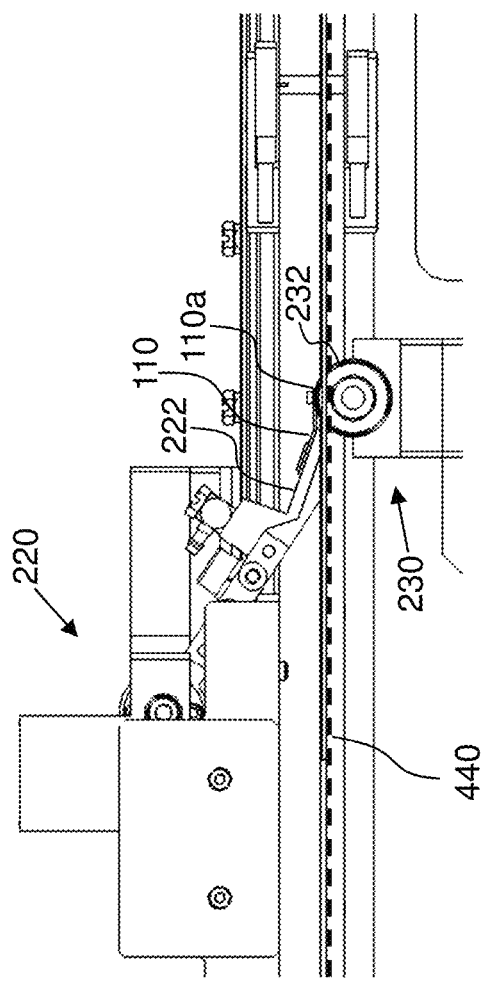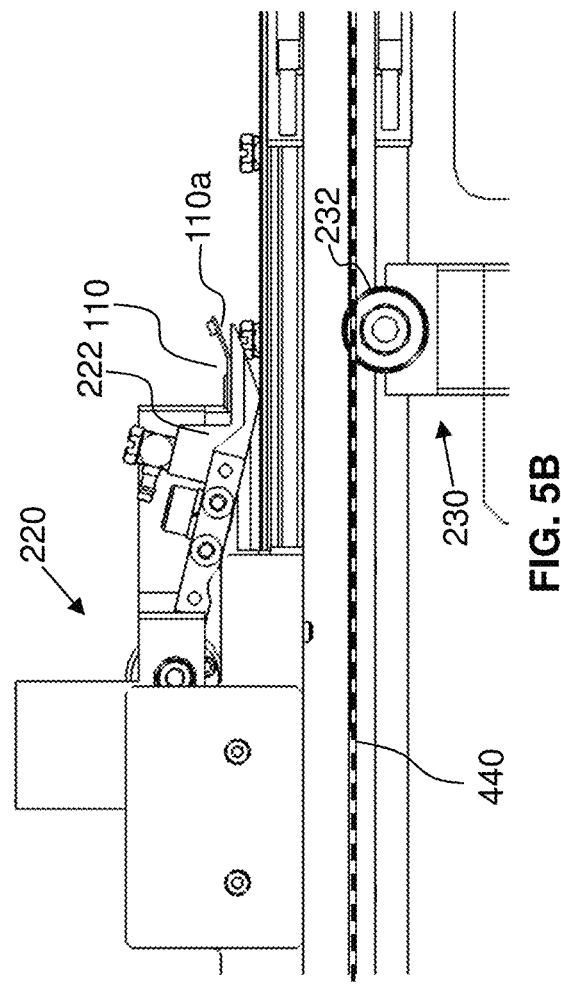

DETAPE APPARATUS FOR AN OPTICAL ALIGNMENT MACHINE

FIELD OF THE INVENTION

The present invention generally relates to a detape apparatus for separating an electronic component from a tape carrier, which may be incorporated in an optical alignment machine for camera modules.

BACKGROUND OF THE INVENTION

Image sensor modules typically go through multiple assembly processes such as die bond, wire bond and oven cure, before undergoing an optical alignment operation. The image sensor modules are placed on tape carriers to be fed into the assembly equipment to undergo optical alignment and assembly processes. A tape carrier includes a carrier frame and a tape that is adhered to the carrier frame. The image sensor modules adhere to the tape on the carrier frame.

During optical alignment operations, an optical alignment machine needs to turn on each image sensor module individually, which requires the image sensor modules to be separated from the tape carrier. A detape apparatus performs the function of separating the image sensor modules from the tape carrier, in a detaping process.

In a conventional method, a detape apparatus separates the image sensor modules from the tape carrier. The separated image sensor modules are then picked up and placed onto a metal carrier which is fed into the optical alignment equipment. Operators may manually transfer the image sensor modules to the metal carrier by hand or by using tools such as tweezers. The manual transfer process is laborious and risks damaging the sensitive image sensor modules.

During the optical alignment operation, the image sensor modules are integrated with lens holders containing lenses to form camera modules. Assembled camera modules are picked up and unloaded.

A typical detape apparatus separates the image sensor modules from the tape carrier by peeling off the tape off from the carrier frame, using a gripper. While the action of peeling off the tape from the carrier frame separates the image sensor modules from the tape, it also destroys the tape carrier. As a result, the tape carrier cannot be reused. Following the optical alignment operation, the completed camera modules need to be placed on new tape carriers.

SUMMARY OF THE INVENTION

The present invention aims to provide a new and useful detape apparatus.

In general terms, the present invention proposes a detape apparatus that separates an electronic component, for example, an image sensor module, from a tape carrier without damaging the tape carrier.

Specifically, a first aspect of the present invention provides a detape apparatus for removing an electronic component from a tape carrier, the detape apparatus comprising: a support unit having a deck surface for supporting the tape carrier, the deck surface defining a support plane on which the tape carrier is supportable; a first urging element including a receiving segment which is movable relative to the support plane between a first retracted position spaced from the tape carrier and a first detape position next to a first side of the tape carrier; a second urging element which is movable relative to the support plane between a second retracted position spaced from the tape carrier and a second detape position abutting a second side of the tape carrier opposite to the first side; and a conveyor configured to move the tape carrier in a conveyance direction along the deck surface. During a detape process, the second urging element is operative to move to the second detape position to thereby push the tape carrier out of the support plane to separate at least one electronic component from the tape carrier, while the receiving segment is operative to move to the first detape position to receive the at least one electronic component which is thus separated from the tape carrier.

In the above detape apparatus, the tape carrier remains intact and fit for reuse after the at least one electronic element is separated from the tape carrier.

The first detape position may be adjacent to the second detape position, such that the at least one electronic component is slidable onto the receiving segment when it is separated from the tape carrier by the second urging element. Further, the second urging element may travel in directions that are substantially normal to the support plane when the second urging element moves between the second retracted position and the second detape position. These preferred directions may allow the second urging element to minimise its required motion distance for separating the electronic component from the tape carrier.

The first urging element and the second urging element may be located on opposite sides of the support unit. This preferred configuration facilitates the manipulation of the tape carrier on opposite sides for separating electronic components.

The receiving segment may be pivotable about a pivot axis that is substantially perpendicular to the conveyance direction, for moving the receiving segment between the first retracted position and the first detape position. This arrangement may allow the receiving segment to have different orientations relative to the support plane when it moves from the first retracted position to the first detape position.

For example, the receiving segment of the first urging element may have a first surface that faces away from the support plane. The first surface may be inclined relative to the support plane when the first urging element is moved to the first detape position. As such, the first surface may form an inclined plane, or a slope, for the at least one separated electronic component to slide onto the receiving segment. When the receiving segment is moved to the first retracted position, the first surface may be substantially parallel to the support plane, for the at least one separated electronic component to be picked up by a collet. This enhances a stability of the at least one separated electronic component to prevent it from, for instance, sliding down the receiving segment as a result of gravity. The separated electronic component may then be picked up by a pick arm or a collet, to be transferred to an optical alignment machine.

The first urging element may be pivotally moved by various means. For example, the receiving segment may be connected to a main body, and the first urging element may further comprise an actuator operative to move the first urging element along the deck surface and a cam follower coupled to the deck surface. The main body may be biased against the cam follower in a direction towards the support plane. With the aforesaid arrangement, the first urging element is pivotally movable without incorporating a rotational motor. When the actuator drives the first urging element to move linearly along the deck surface relative to the cam follower, this would effect rotation of the main body and the receiving segment. In another example, the detape apparatus may further include a motor configured to rotate the receiving segment, and a pair of stoppers located above and below the receiving segment respectively for limiting a range of pivotal motion of the receiving segment.

Alternatively, or additionally, the receiving segment may further comprise at least one suction hole configured to generate a suction force to retain the at least one separated electronic component on the receiving segment.

The support unit may have an opening, wherein in use, the deck surface supports the tape carrier across the opening. The first urging element and the second urging element may be aligned with the opening on opposite sides of the opening. The second urging element may further be extendable through the opening for abutting the tape carrier, in order to push the tape carrier. This arrangement may provide the optimal configuration for pushing adjacent sections of the tape carrier from opposite sides to detape the at least one electronic component.

The second urging element may include at least one roller having a rotational axis that is substantially perpendicular to the conveyance direction. The at least one roller helps to reduce friction between the second urging element and the tape carrier such that the tape carrier may move onto to the second urging element without creasing of the tape on the tape carrier.

The detape apparatus may further include a drive unit configured to move at least one of the first urging element and second urging element relative to each other along the support plane. With this feature, the first urging element and the second urging elements may for example be positioned accordingly based on dimensions of the electronic components that are being worked on, when performing the detaping operation.

The detape apparatus may further include a collet configured to pick up the separated electronic component from the receiving segment. The collet may further include a clamper shaped to push against a part of the electronic component for straightening a separated electronic component in case the separated electronic component is bent. In this manner, the collet may resolve any warping or bending of the electronic component that may be present.

A second aspect of the present invention is an optical alignment machine that includes the abovementioned detape apparatus. The optical alignment machine avoids the need for an additional tape carrier to carry the electronic component following an assembly operation such as the optical alignment operation, as the electronic component may be re-loaded back to the original tape carrier. The optical alignment machine that integrates the detape apparatus may reduce manpower required to transfer the electronic components between different tape carriers, as well as optimizes the use of clean room space.

BRIEF DESCRIPTION OF THE FIGURES

Embodiments of the invention will now be illustrated for the sake of example only with reference to the following drawings, in which:

FIGS. 5A and 5B show side views of the detape apparatus of FIG. 2A performing a detape process on an electronic component that is bent;

DETAILED DESCRIPTION OF THE EMBODIMENTS

Figure 1A:
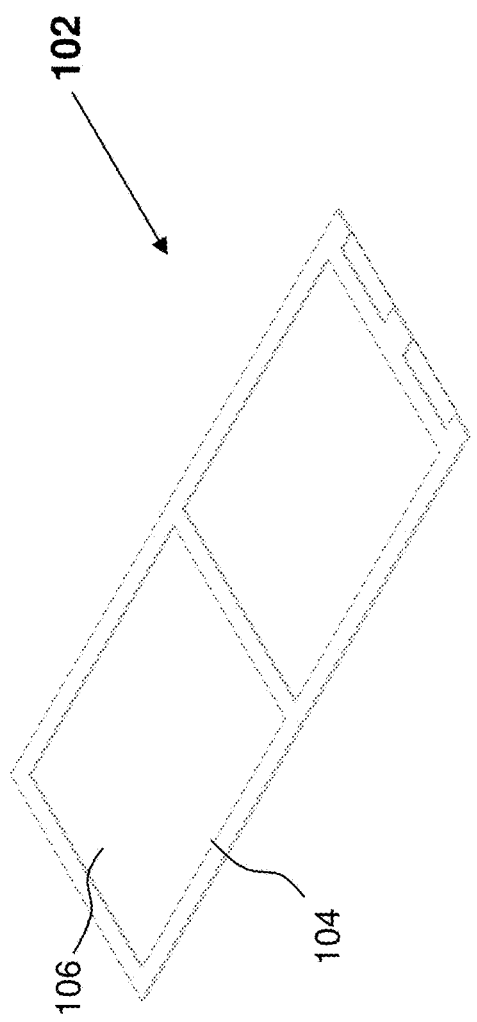
FIGS. 1A and 1B show perspective views of an empty tape carrier and a loaded tape carrier respectively.
Figure 1B:
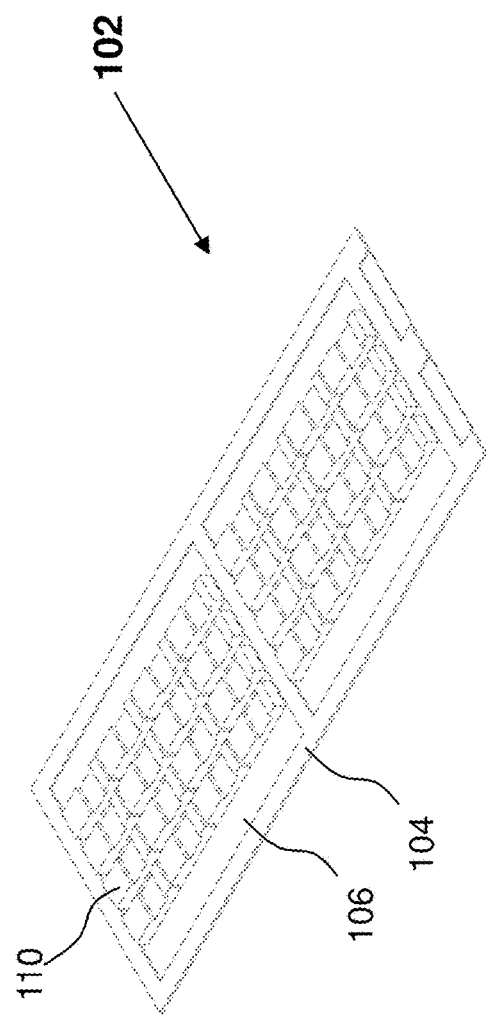

FIGS. 1A and 1B show perspective views of an empty tape carrier 102 and a loaded tape carrier 102 respectively. The tape carrier 102 includes a frame 104 and a tape 106 adhered to the frame 104. One or more electronic components 110 can be placed on the tape 106 of the tape carrier 102. The electronic components may be arranged on the tape 106 in a matrix arrangement. A detape apparatus may be configured to separate the one or more electronic components 110 from the loaded tape carrier 102.

Figure 2A:
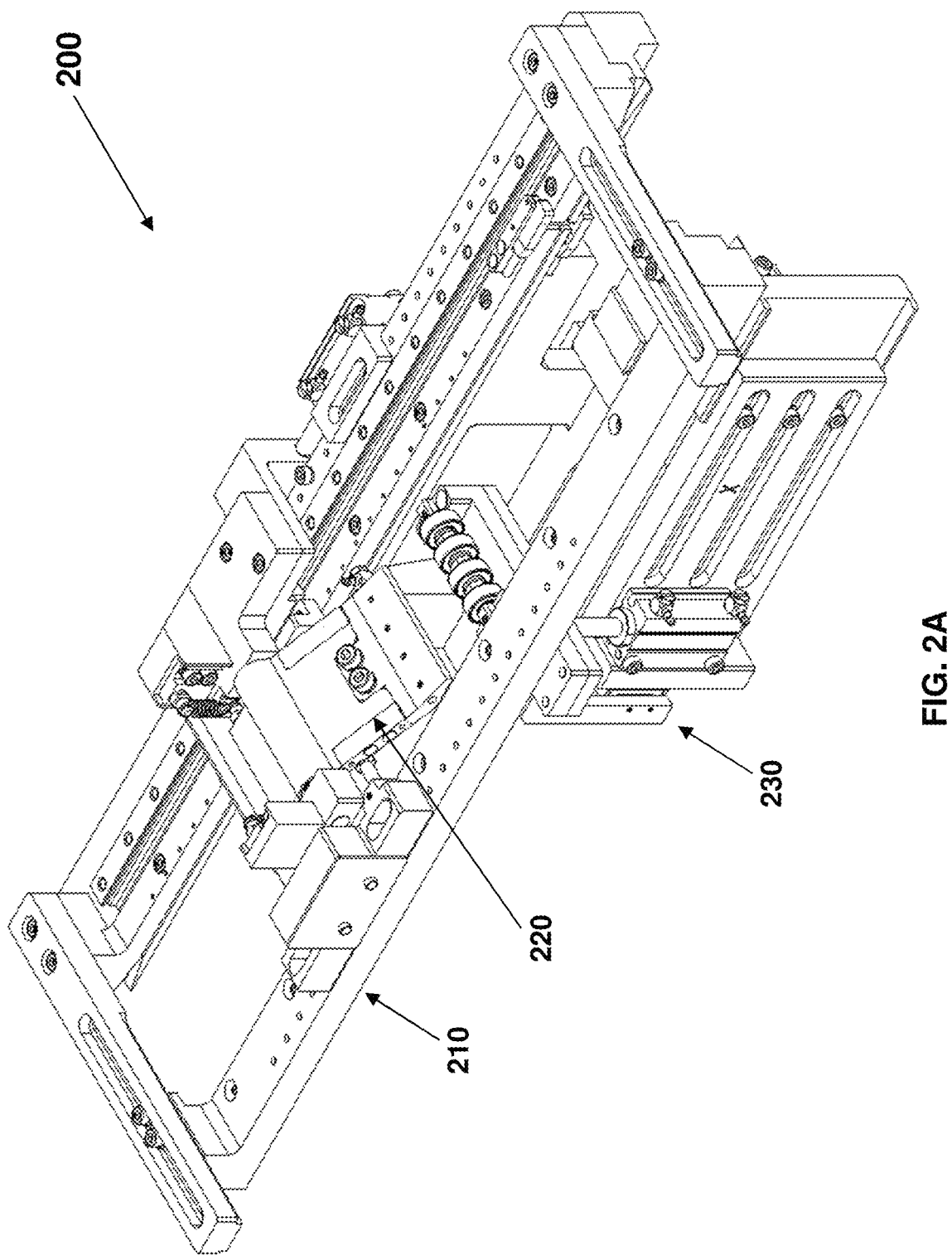
FIG. 2A shows a perspective view of a detape apparatus according to an embodiment of the present invention.

FIG. 2A shows a perspective view of a detape apparatus 200 according to an embodiment of the present invention. The detape apparatus 200 includes a support unit 210, a first urging element 220 and a second urging element 230. As shown in FIG. 2A, the first urging element 220 and the second urging element 230 are attached onto opposite sides of the support unit 210. The support unit 210, the first urging element 220 and the second urging element 230 will be described in greater detail below with reference to FIGS. 2B, 2C and 2D.

Figure 2B:
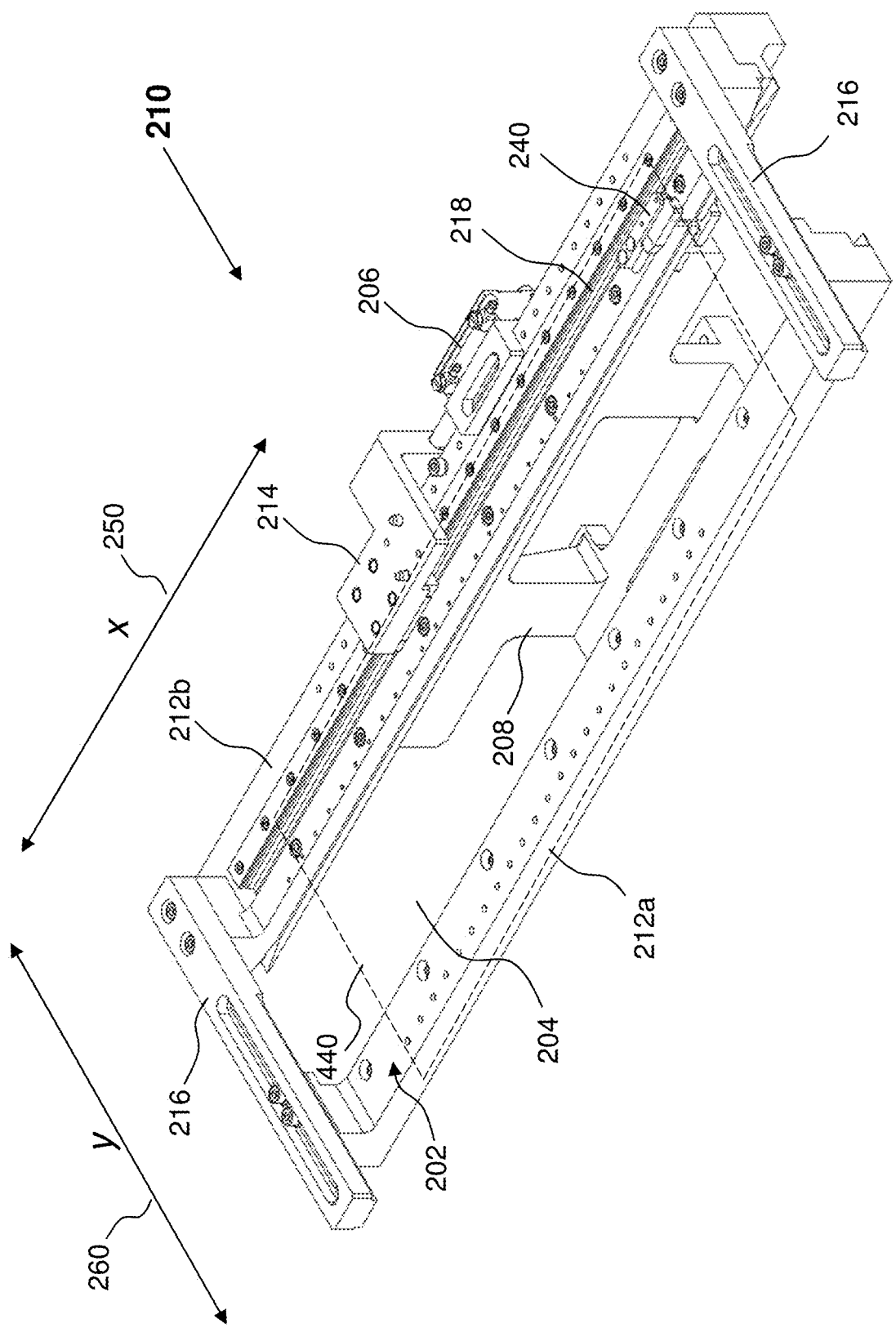
FIGS. 2B, 2C and 2D respectively show standalone perspective views of the support unit, a first urging element and a second urging element of the detape apparatus of FIG. 2A.

In particular, FIG. 2B shows a standalone perspective view of the support unit 210. As shown in FIG. 2B, the support unit 210 includes two longitudinal bars 212a, 212b arranged at least substantially parallel to one another. The support unit 210 also includes two lateral bars 216 that hold the two longitudinal bars 212a, 212b together. Each lateral bar 216 is arranged over an upper surface of each of the two longitudinal bars 212a, 212b. The upper surfaces are collectively referred to herein as the deck surface 202 of the support unit 210.

For ease of reference, the deck surface 202 is said to define a support plane 440. The support plane has opposite first and second sides. The longitudinal axis 250 of the support plane is denoted as 'x' and the lateral axis 260 of the support plane 440 is denoted as 'y'. The longitudinal axis 250 is parallel to the longitudinal bars 212. The lateral axis 260 is perpendicular to the longitudinal axis 250.

The support unit 210 has an opening 204 between the two longitudinal bars 212a, 212b. The deck surface 202 serves to support a tape carrier 102 on the support plane 440 across the opening 204 when the detape apparatus is in use. As shown in FIG. 2A, in the detape apparatus 200, each of the first urging element 220 and the second urging element 230 are aligned with the opening 204 on opposite sides of the opening 204, and are arranged about a longitudinal centreline of the support plane 440. Furthermore, the second urgent element 230 is extendable through the opening 204 to abut the tape carrier 102.

The support unit 210 includes a mounting plate 214 attached to one of the longitudinal bars 212a, 212b, for example the longitudinal bar 212b. The mounting plate 214 includes an actuator 206 attached to the same longitudinal bar 212b. The mounting plate 214 is slidable along the longitudinal axis 250. The same longitudinal bar 212b includes a guide track 218 arranged in the longitudinal direction. The guide track 218 may be a groove that is cut into the longitudinal bar 212, or a rail extending along a top surface of the longitudinal bar 212. The mounting plate 214 is configured for attachment by the first urging element 220 (as shown in FIG. 2A), so that the first urging element 220 can be arranged over the deck surface 202. The actuator 206 is configured to move the mounting plate 214 along the longitudinal axis 250, and thereby move the first urging element 220.

The support unit 210 further includes a conveyor 240. The conveyor 240 is configured to move a tape carrier (not shown in FIGS. 2A to 2D) supported on the deck surface 202 in a conveyance direction along the longitudinal axis 250. The conveyor 240 is shown in the form of an indexer that slides along the deck surface 202.

The support unit 210 also includes an undercarriage 208. The undercarriage 208 is arranged below the longitudinal bars 212a, 212b and the opening 204. The undercarriage 208 serves to facilitate attachment of the second urging element 230 (as shown in FIG. 2C) to the support unit 210.

Figure 2C:
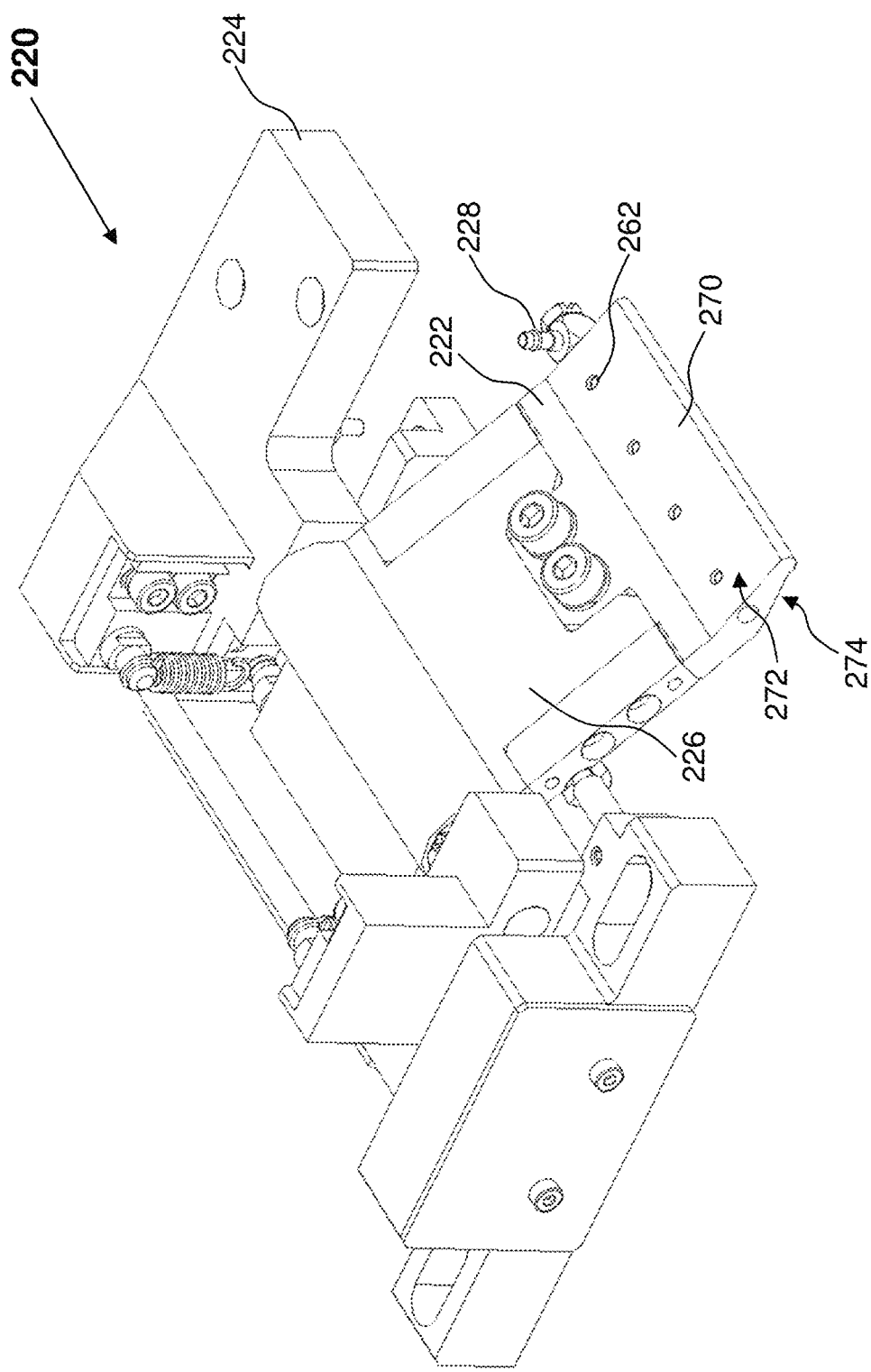

FIG. 2C shows a standalone perspective view of the first urging element 220.

Referring to FIG. 2C, the first urging element 220 includes an anchor member 224. The anchor member 224 is configured to be attachable to the mounting plate 214 of the support unit 210. The first urging element 220 also includes a tray 222 that is pivotable about a pivot shaft and a pivot mechanism configured to move the tray 222 about this pivot shaft. The pivot mechanism will be described in greater detail below with reference to FIGS. 4A to 4E.

The tray 222 includes a main body 226 and receiving segment for receiving electronic components 110, such as a receiving end segment 270 as illustrated in FIG. 2C. The receiving end segment 270 is angled relative to the main body 226. The first urging element further includes a vacuum inlet 228 coupled to the receiving end segment 270. The receiving end segment 270 includes a plurality of suction holes 262. The vacuum inlet 228 is configured to draw air into the suction holes 262 so as to create a suction force on the first surface 272 of the receiving end segment 270. The receiving end segment 270 also has a second surface 274 opposite to the first surface 272.

When the first urging element 220 is attached to the support unit 210 (as shown in FIG. 2A), the first surface 272 faces away from the support plane of the deck surface 202 whereas the second surface 274 faces the support plane of the deck surface 202. The first surface 272 and the second surface 274 converge to form an acute angle. In other words, the receiving end segment 270 has a tapered side profile.

Figure 2D:
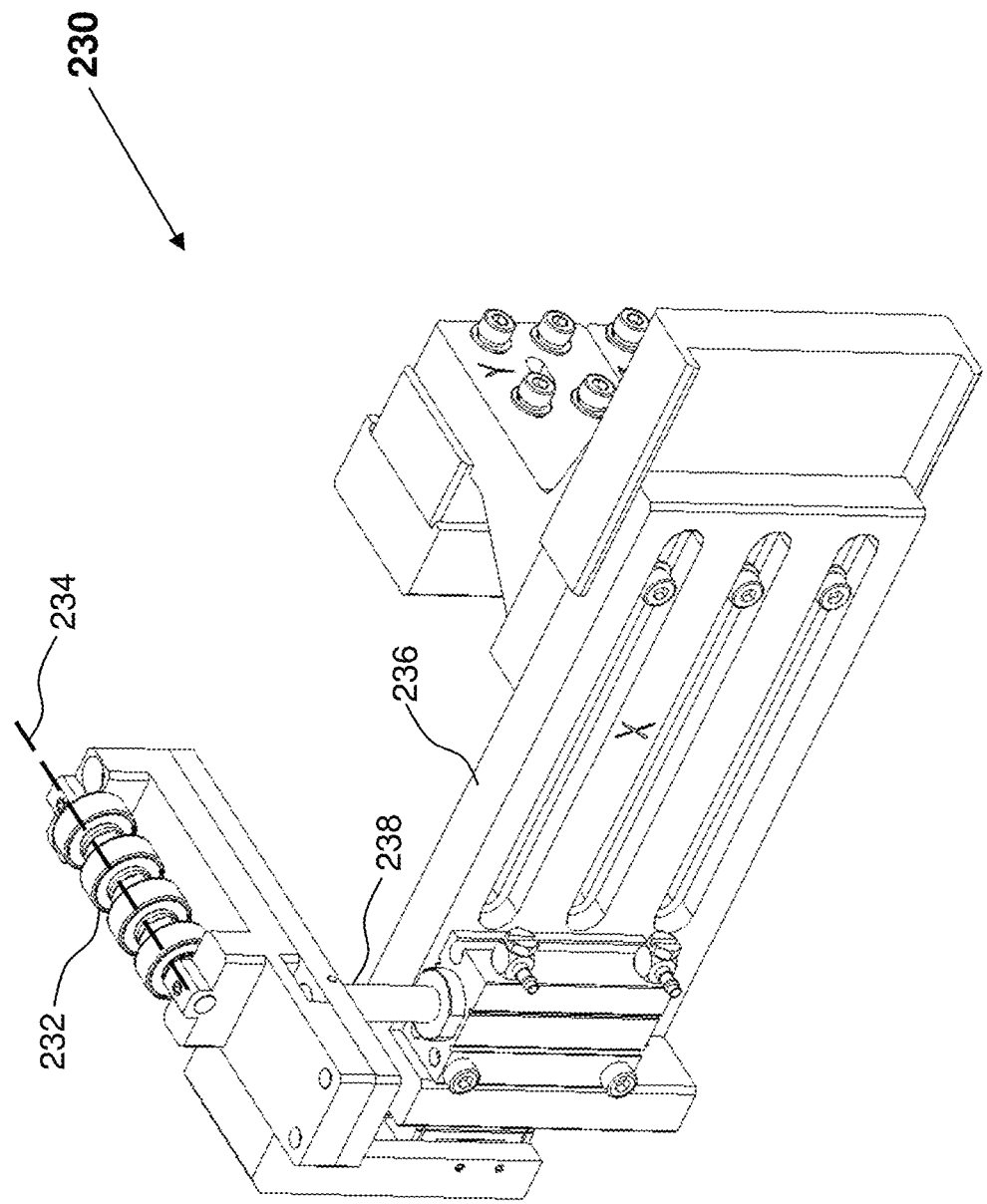

FIG. 2D shows a standalone perspective view of the second urging element 230.

The second urging element 230 includes rollers 232 configured to rotate about a rotational axis 234. The second urging element 230 further includes an attachment member 236 arranged under the rollers 232. The attachment member 236 is configured to be attachable to the support unit 210 as shown in FIG. 2A. The second urging element 230 further includes an elevation shaft 238 that connects the rollers 232 to the attachment member 236. The elevation shaft 238 is extendable from the attachment member 236 to vary a distance between the rollers 232 and the attachment member 236. In other words, when the attachment member 236 is attached to the support unit 210, the elevation shaft 238 is configured to move the rollers 232 relative to the support unit 210.

Figure 3:
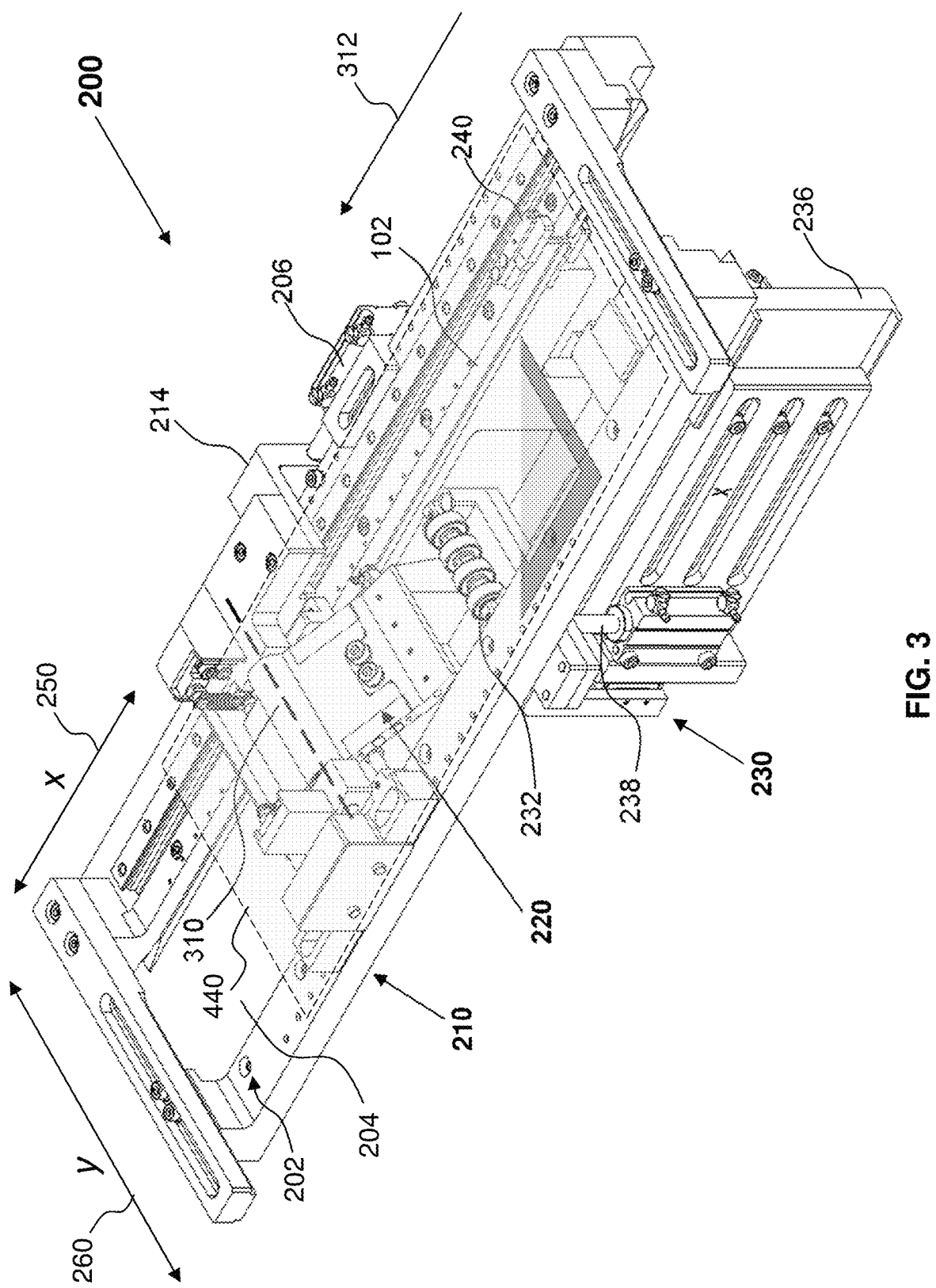
FIG. 3 shows a perspective view of the detape apparatus of FIG. 2A in use.

FIG. 3 shows a perspective view of the detape apparatus 200, in use.

As shown in FIG. 3, prior to initiating a detaping process, the tape carrier 102 is placed on the deck surface 202 of the support unit 210, between the conveyor 240 and the first urging element 220. When the conveyor 240 moves in a conveyance direction 312 parallel to the longitudinal axis 250, the conveyor 240 pushes the tape carrier 102 towards the first urging element 220.

FIGS. 4A, 4B, 4C and 4D show side views of the detape apparatus 200 in various stages of a detape operation, according to an embodiment of the present invention.

Figure 4A:
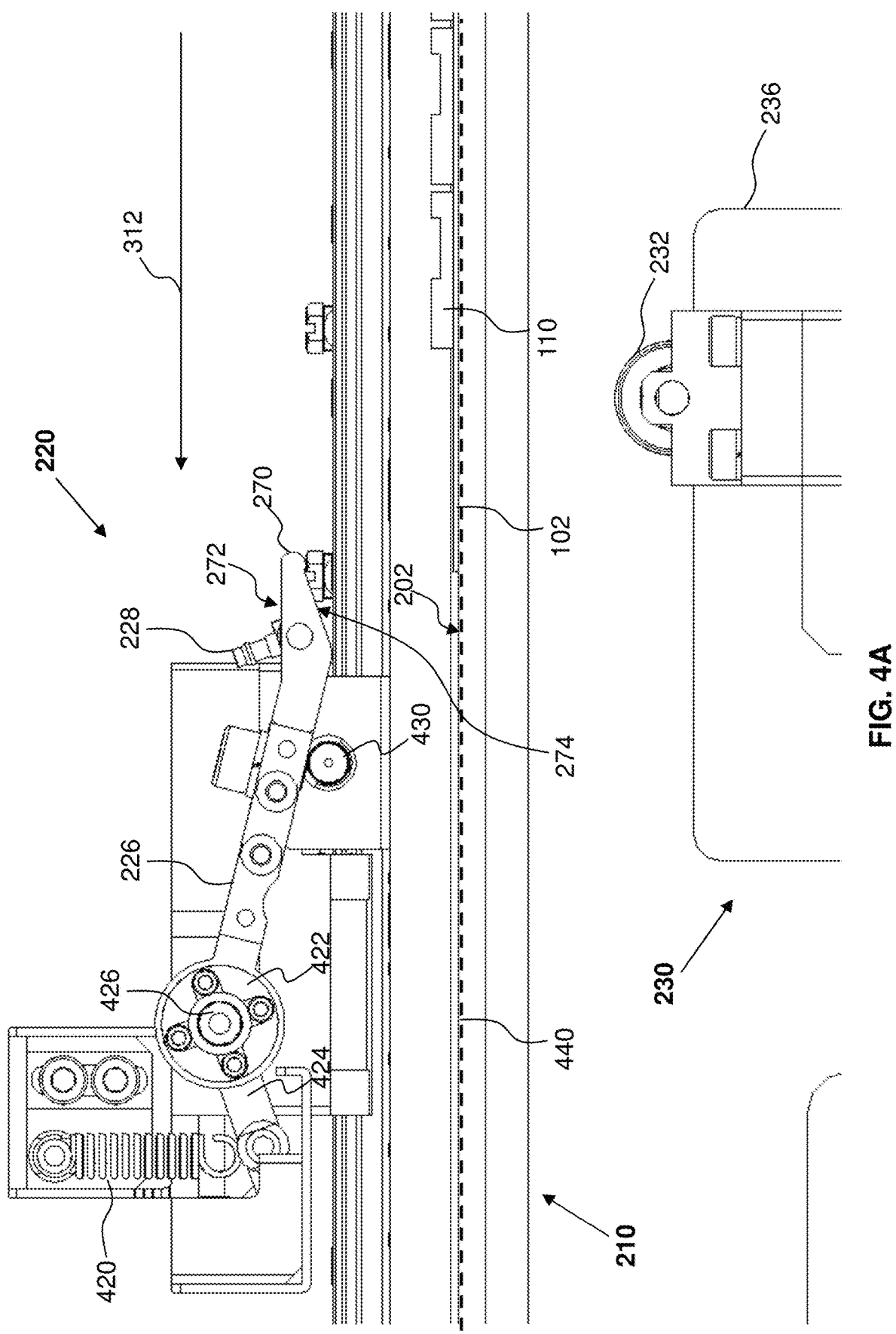
FIGS. 4A, 4B, 4C and 4D show side views of the detape apparatus of FIG. 2A in various stages of a detape operation.

Referring to FIG. 4A, the detape apparatus 200 is in an initial state before the detape process. The support plane 440 is indicated in dashed line for ease of reference. A tape carrier 102 carrying an electronic component 110 is placed on the deck surface 202. In the initial state before the detape process, the receiving end segment 270 of the first urging element 220 is in a first retracted position, where the receiving end segment 270 is separated and spaced from the support plane 440. The second urging element 230 is in a second retracted position, where the rollers 232 are also spaced from the support plane 440.

Figure 4B:
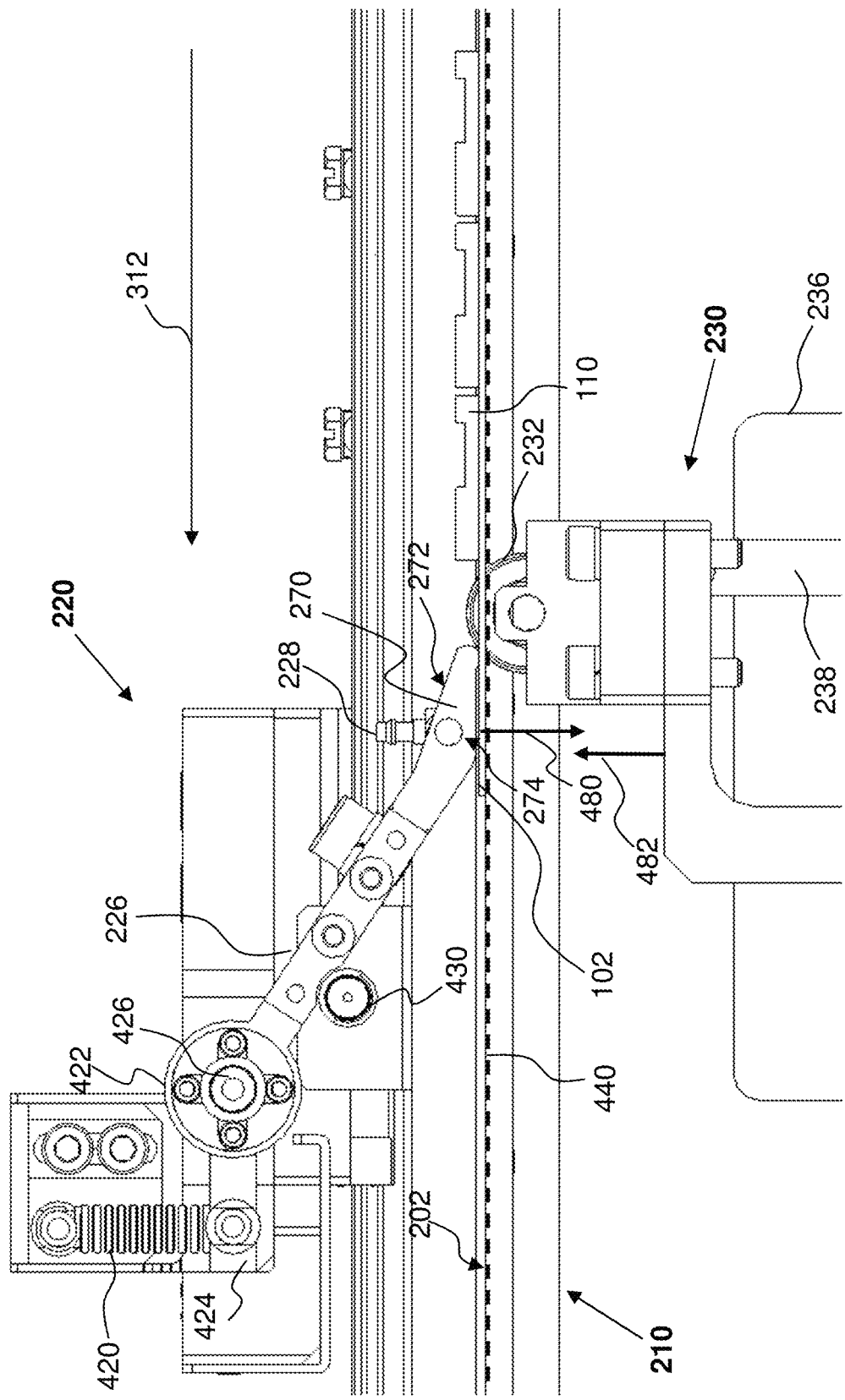

Next, as shown in FIG. 4B, to begin the detape process, the conveyor 240 moves the tape carrier 102 along the conveyance direction 312 until an empty section of the tape carrier 102 lies under the receiving end segment 270 and above the rollers 232, while the electronic component 110 is offset from the rollers 232 along the conveyance direction 312.

The first urging element 220 then moves along the longitudinal axis 250 to position its receiving end segment 270 adjacent to the rollers 232. The receiving end segment 270 of the first urging element 220 further moves in the first direction 480 to a first detape position and simultaneously the second urging element 230 moves in the second direction 482 to a second detape position. In particular, the pivot mechanism of the first urging element 220 moves the tray 222 to the first detape position, and the elevation shaft 238 extends from the attachment member 236 to move the rollers 232 to the second detape position. Each of the first direction 480 and the second direction 482 is generally or substantially transverse, or normal, to the support plane 440. With respect to the conveyance direction 312, the second urging element 230 is arranged upstream of the receiving end segment 270.

As shown in FIG. 4B, in the first detape position, the second surface 274 of the receiving end segment 270 of the tray 222 is next to the tape carrier 102 and at least substantially parallel to the support plane 440. More preferably, the second surface 274 lies flat on the tape carrier 102. The receiving end segment 270 may abut a first side of the empty section of the tape carrier 102, to slightly bias the empty section of the tape carrier 102 on the support plane 440. In the first detape position, the first surface 272 of the receiving end segment 270 is inclined relative to the tape carrier 102 and the support plane 440.

As shown in FIG. 4B, in the second detape position, the rollers 232 are displaced upwards to contact a second side of the empty section of the tape carrier 102. The rollers 232 lift the empty section of the tape carrier 102 away from the support plane 440.

Figure 4C:
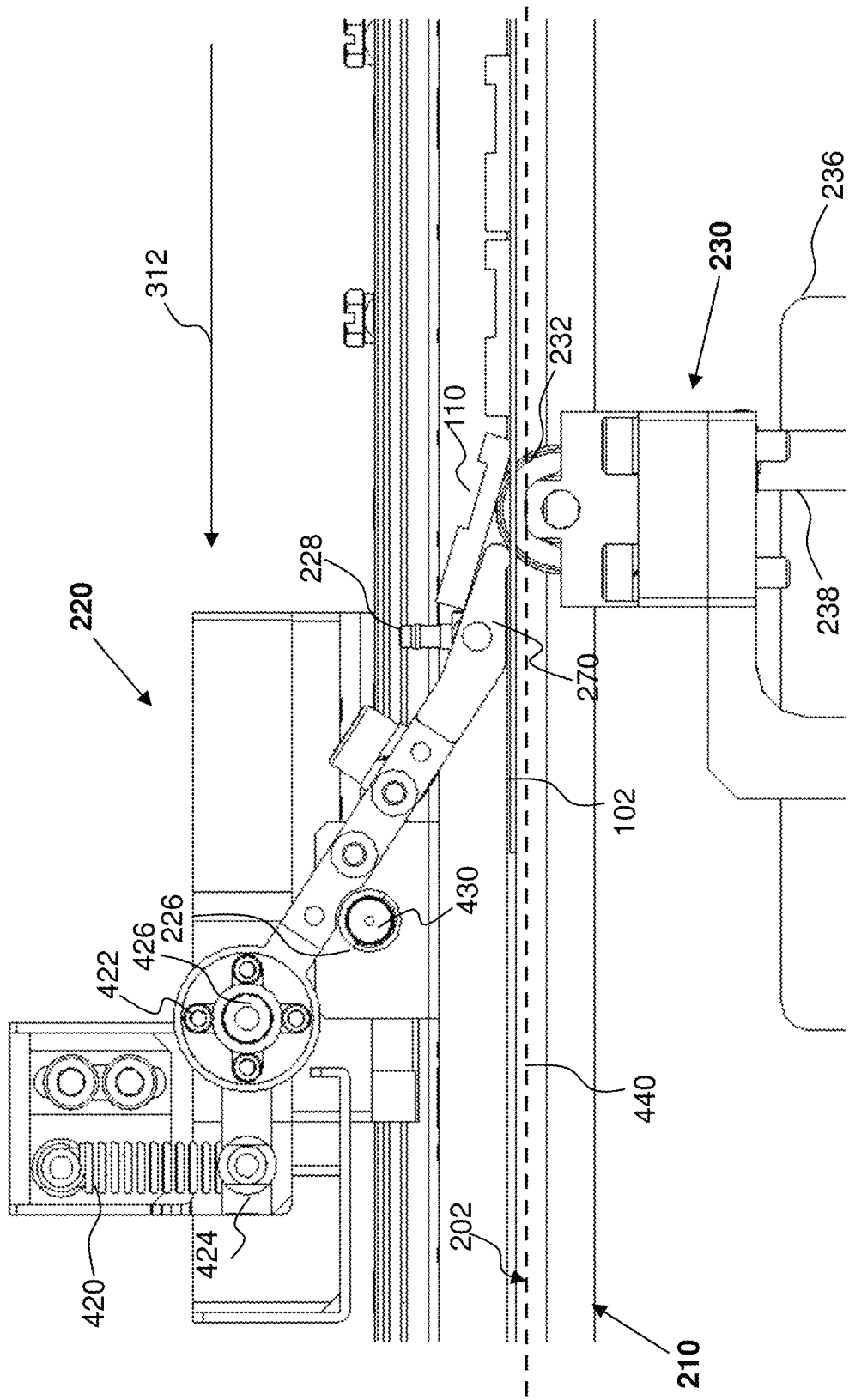

Next, as shown in FIG. 4C, the conveyor 240 moves the tape carrier 102 along the conveyance direction 312, to a transfer position, where the electronic component 110 lies directly above the rollers 232. With the second urging element 230 in the second detape position, the rollers 232 push the tape carrier 102 together with the electronic component 110 out of the support plane 440, while the receiving end segment 270 continues to retain the empty section of the tape carrier 102 upstream of the electronic component 110 on the support plane 440. As a result, the electronic component 110 detaches from the tape carrier 102. The receiving end segment 270 forms a slope adjacent to the rollers 232, such that the detached electronic component 110 is slidable onto the first surface 272 of the receiving end segment 270.

Figure 4D:
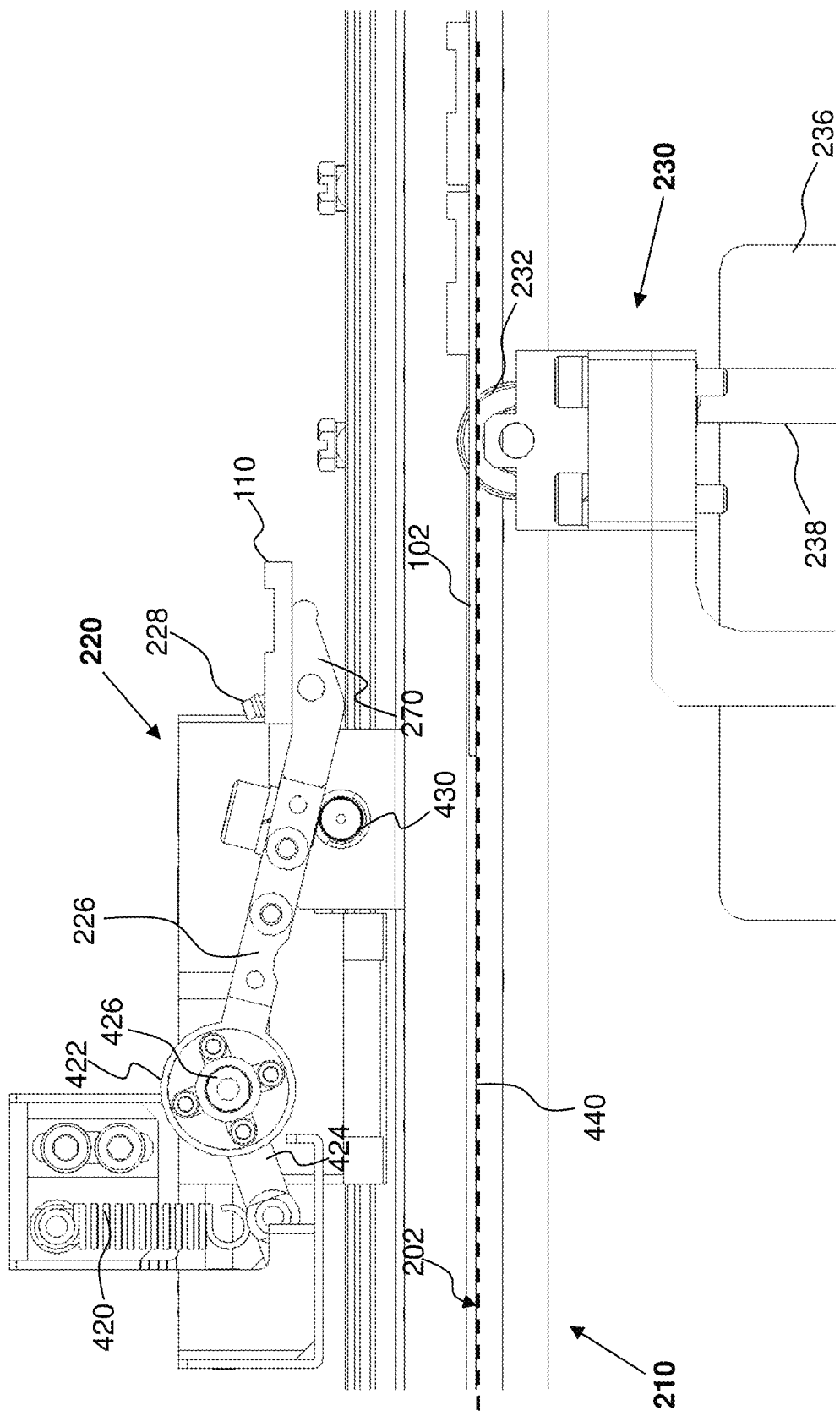

After the detached electronic component 110 is securely supported on the receiving end segment 270, receiving end segment 270 pivots back to the first retracted position, as shown in FIG. 4D. In the first retracted position, the first surface 272 of the receiving end segment 270 is at least substantially parallel to the support plane 440, to prevent the electronic component 110 from slipping down due to gravitational force, thereby facilitating pick-up of the separated electronic component 110.

The receiving end segment 270 further retains the electronic component 110 on its first surface 272 by way of a suction force generated by the vacuum inlet 228. A pick arm, which comprises a collet, can then retrieve the electronic component 110 from the receiving end segment 270. The pick arm may thereafter transfer the electronic component 110 to a processing device. The processing device processes the electronic component 110 to form a processed electronic component 450. The pick arm then transfers the electronic component 450 back to the detape apparatus 200.

Figure 4E:
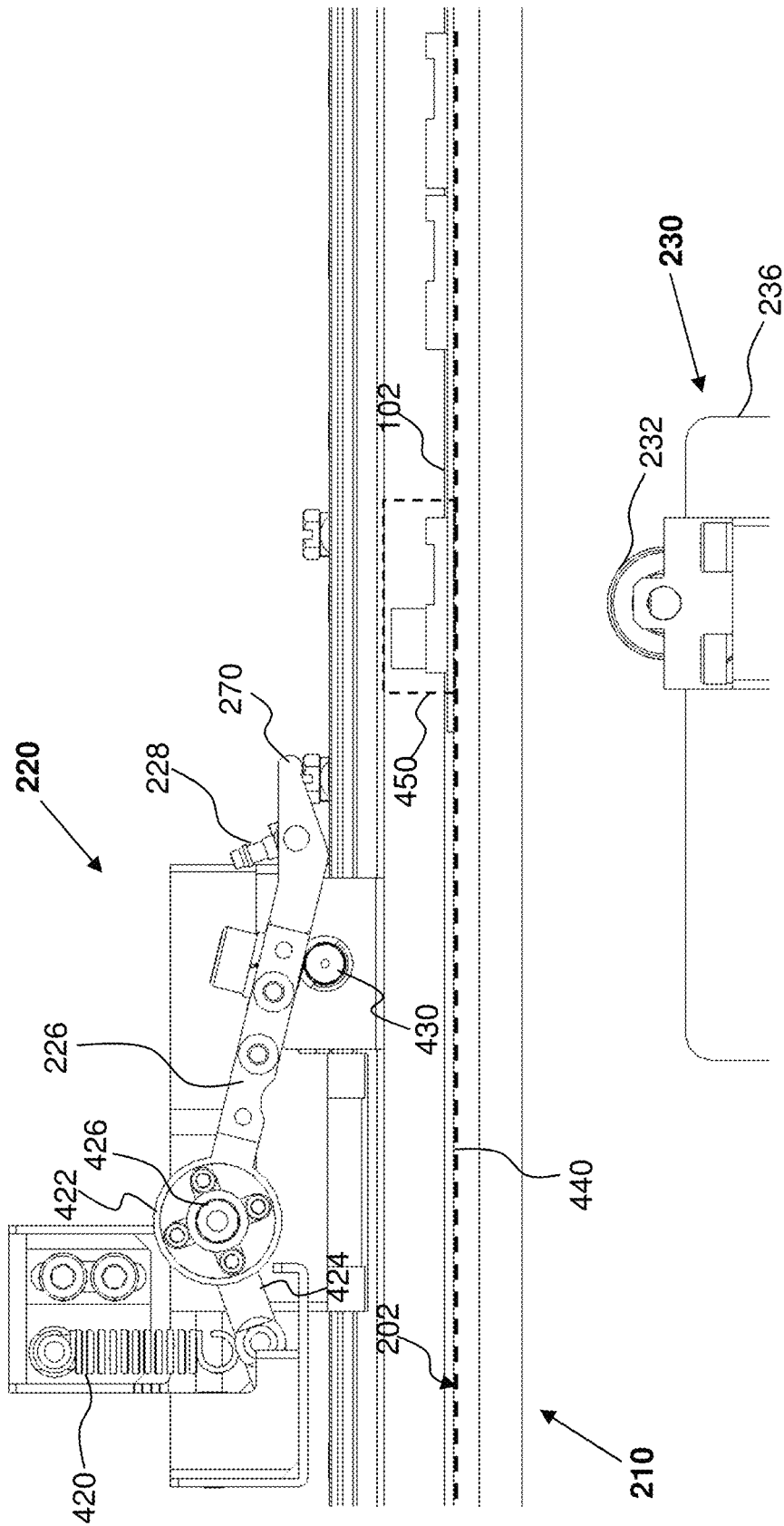
FIG. 4E shows a side view of the detape apparatus of FIG. 2A after the separated electronic component is returned to the detape apparatus.

FIG. 4E shows a side view of the detape apparatus 200 after the separated electronic component 110 has undergone processing to form the processed electronic component 450 and the processed electronic component 450 is returned to the detape apparatus 200. The receiving end segment 270 of the first urging element 220 is in the first retracted position. The second urging element 230 returns to the second retracted position, where the rollers 232 are not in contact with the tape carrier 102. After the separated electronic component 110 has undergone the above-mentioned processing, the processed electronic component 450 is transferred back to the tape carrier 102 while the tape carrier 102 is still being held by the support unit 210. This is possible because the detaping process shown in FIGS. 4A to 4D separates the electronic component 110 from the tape carrier 102 while maintaining the integrity of the tape carrier 102.

The detape apparatus 200 can continue to detape the remaining rows of electronic components 110 on the tape carrier 102, by repeating the processes shown in FIGS. 4A to 4D, after the conveyor 240 (not shown in FIGS. 4A to 4E) moves the tape carrier 102 forward such that the next row of electronic components 110 are at the transfer position directly above the rollers 232.

As mentioned above, the first urging element 220 includes a pivot mechanism configured to move the tray 222. The pivot mechanism, as shown in FIGS. 4A to 4E, is a cam-drive pivot mechanism. The cam-drive pivot mechanism includes a rotation member 422, a pivot shaft 426, a lever arm 424, a biasing member 420 and a cam follower 430. The rotation member 422 is fitted over the pivot shaft 426, and is rotatable about the pivot shaft 426. The rotation member 422 is coupled to each of the main body 226 of the tray 222 and the lever arm 424. The lever arm 424 and the main body 226 are arranged about the rotation member 422 on at least substantially opposite sides, for example, within a range of 90 degrees to 180 degrees relative to one another. The lever arm 424 is biased by the biasing member 420, for example, a tension spring, such that the tray 222 is biased towards the support plane 440. In other words, the receiving end segment 270 of the first urging element 220 is biased to the first detape position. The main body 226 is inclined relative to the support plane 440 in each of the first detape position and the first retracted position. The actuator 206 of the support unit 210 is configured to move the first urging element 220 linearly, along the guide track 218 on the deck surface 202. The cam follower 430 is coupled to the deck surface 202, for example, affixed on the guide track 218. The cam follower 430 extends under the main body 226 of the tray 222. A bottom surface of the main body 226 that faces the support plane 440 is biased against the cam follower 430 in a direction towards the support plane 440. As the main body 226 is inclined towards the support plane 440, the cam follower 430 pushes the main body 226 away from the support plane 440, against the biasing force from the biasing member 420, as the first urging element 220 (along with the main body 226) is driven by the actuator 206 to move along the deck surface 202. As such, linear movement of the actuator 240 causes the tray 222 to pivot about the pivot shaft 422.

During the detape process, the detape apparatus 200 may accidentally warp or bend part of the electronic component 110. FIGS. 5A and 5B show side views of the detape apparatus 200 performing a detape process during which the electronic component 110 is bent.

Referring to FIG. 5A, when the second urging element 230 pushes against the tape carrier 102 and the electronic component 110 lying thereon out of the support plane 440, the second urging element 230 may for instance cause a portion of the electronic component 110 to bend in the direction of the pushing force.

Referring to FIG. 5B, the bent portion of the electronic component 110 may remain bent after the receiving end segment 270 moves to the first retracted position. The bent portion of the electronic component 110 may be the flexible printed circuit (FPC) portion of the electronic component 110. The bent FPC may affect the success rate of switching on the electronic component 110.

As mentioned above, the electronic component 110 on the tray 222 of the first urging element 220 is picked up by a collet. This collet may be configured to reduce the extent to which the electronic component 110 is bent.

Figure 6:
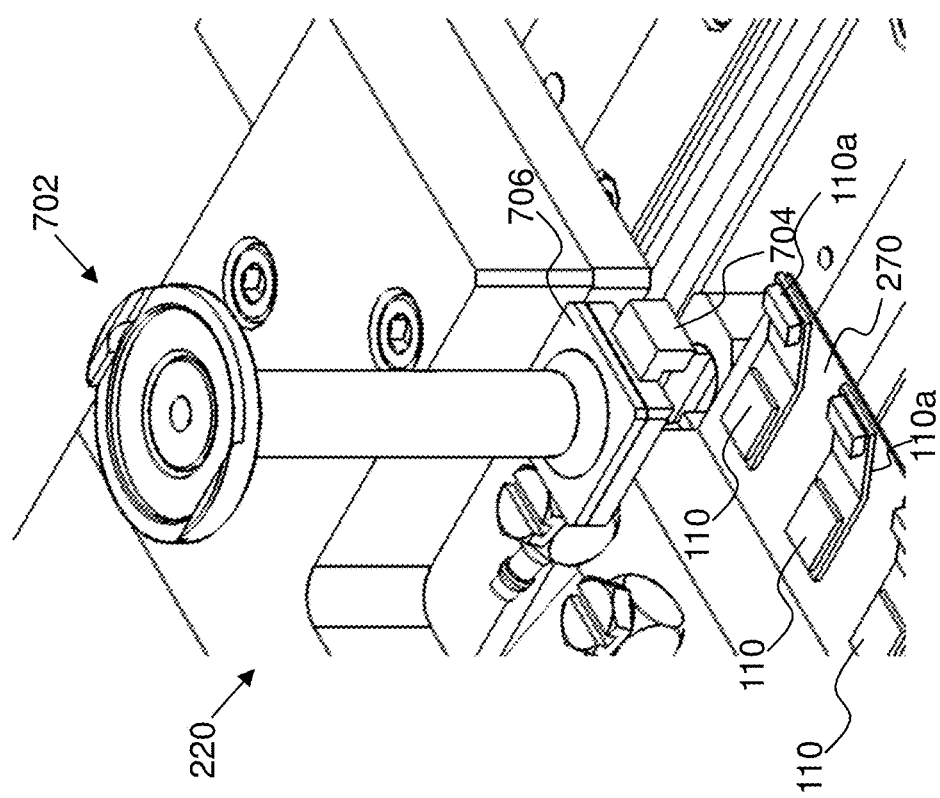
FIG. 6 shows a collet according to an embodiment of the present invention.

FIG. 6 shows a collet 706 configured to retrieve the electronic component 110 from the first urging element 220 and is further configured to reduce the extent the electronic component 110 is bent according to an embodiment of the present invention. The collet 706 is located at an end of a pickup member 702 and is configured to retain or hold onto the electronic component 110. The collet 706 has a pickup surface that faces the electronic component 110 when it is holding onto the electronic component 110. The collet 706 further includes a clamper 704 coupled to the collet 706. The clamper 704 is shaped to push against the bent portion 110a of the electronic component 110 so as to straighten the bent portion 110a. In particular, the clamper 704 has a segment that extends transversely relative to the pickup surface, for pushing against the bent portion 110a when the collet 706 contacts the electronic component 110.

Figure 7C:
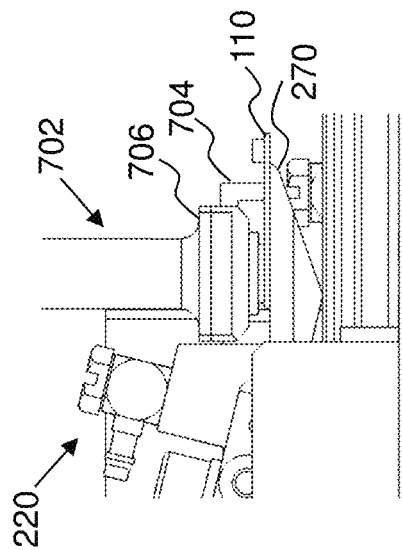
FIGS. 7A to 7C show side views illustrating a method of straightening a bent electronic component using the collet of FIG. 6.
Figure 7B:
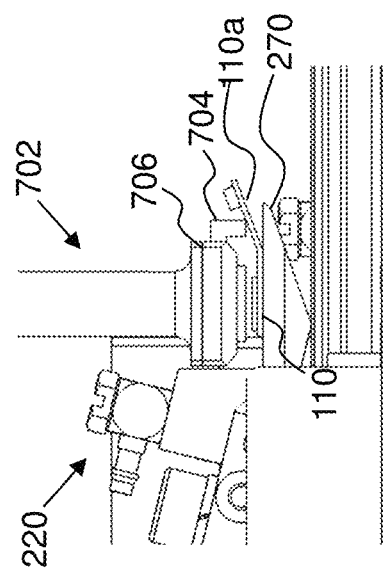
Figure 7A:
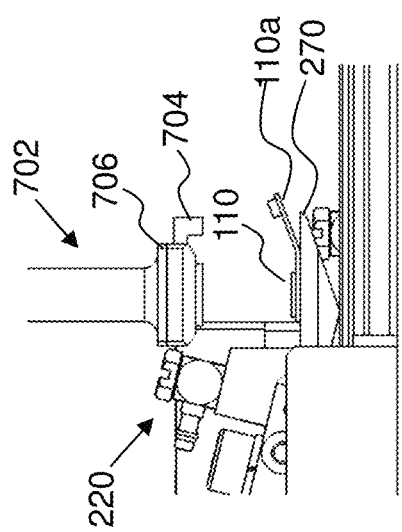

FIGS. 7A to 7C show side views illustrating a method of straightening the bent electronic component 110 using the collet 706.

FIG. 7A shows that the electronic component 110 is partially bent, while lying on the receiving end segment 270 of the first urging element 220.

FIG. 7B shows that as the collet 706 moves towards the receiving end segment 270, the clamper 704 contacts the bent portion that is inclined towards the clamper 704.

Referring to FIG. 7C, the collet 706 continues to move towards the electronic component 110, until the collet 706 contacts the electronic component 110. The clamper 704 pushes the bent portion onto the first surface 272 of the receiving end segment 270, thereby straightening the electronic component 110.

The detape apparatus 200 described above can be re-tooled to work with tape carriers 102 of different sizes or different loading densities, by changing the design of the tray 222 and the rollers 232.

Figure 9:
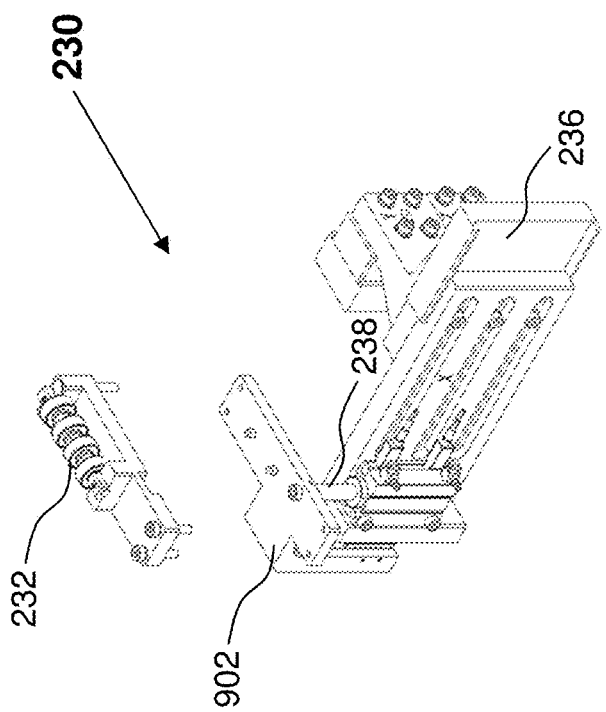
FIGS. 8 and 9 show exploded views of parts of the first urging element and second urging element respectively of FIG. 2A.
Figure 8:
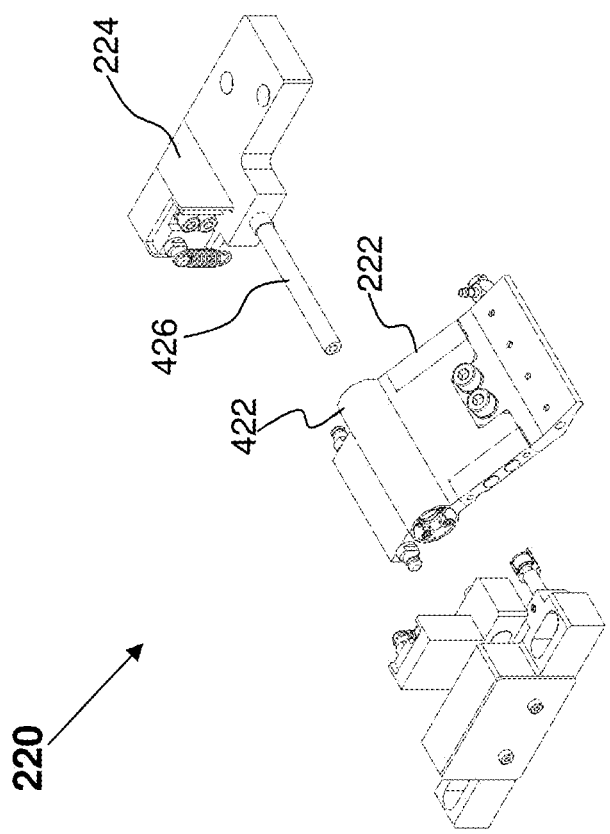

FIGS. 8 and 9 show exploded views of parts of the first urging element 220 and second urging element 230 respectively of FIG. 2A.

Referring to FIG. 8, the first urging element 220 can be disassembled to change the tray 222. The anchor member 224 is made up of two parts that hold the pivot shaft 426 in between them. The anchor member 224 can be detached to reveal the pivot shaft 426. The tray 222, together with the rotation member 422, can be detached from the pivot shaft 426. To re-tool the detape apparatus 200, a new tray 222 with its respective rotation member 422, can be fitted onto the pivot shaft 426, before reassembling the two parts of the anchor member 224.

Referring to FIG. 9, the second urging element 230 can be disassembled to change the rollers 232. The attachment member 236 includes a plate member 902. The rollers 232 are affixed to the plate member 902 by fastening means, for example, screws. The fastening means can be unfastened, to detach the rollers 232 from the plate member 902. A new set of rollers 232 can be arranged over the plate member 902 and then secured to the plate member 902 using the fastening means.

As mentioned above with reference to FIG. 4D, the electronic component 110 is transferred to a processing device for processing and the processed electronic component 450 is returned to the detape apparatus 200. This processing may be an optical alignment of a lens relative to an electronic component 110.

Figure 10:
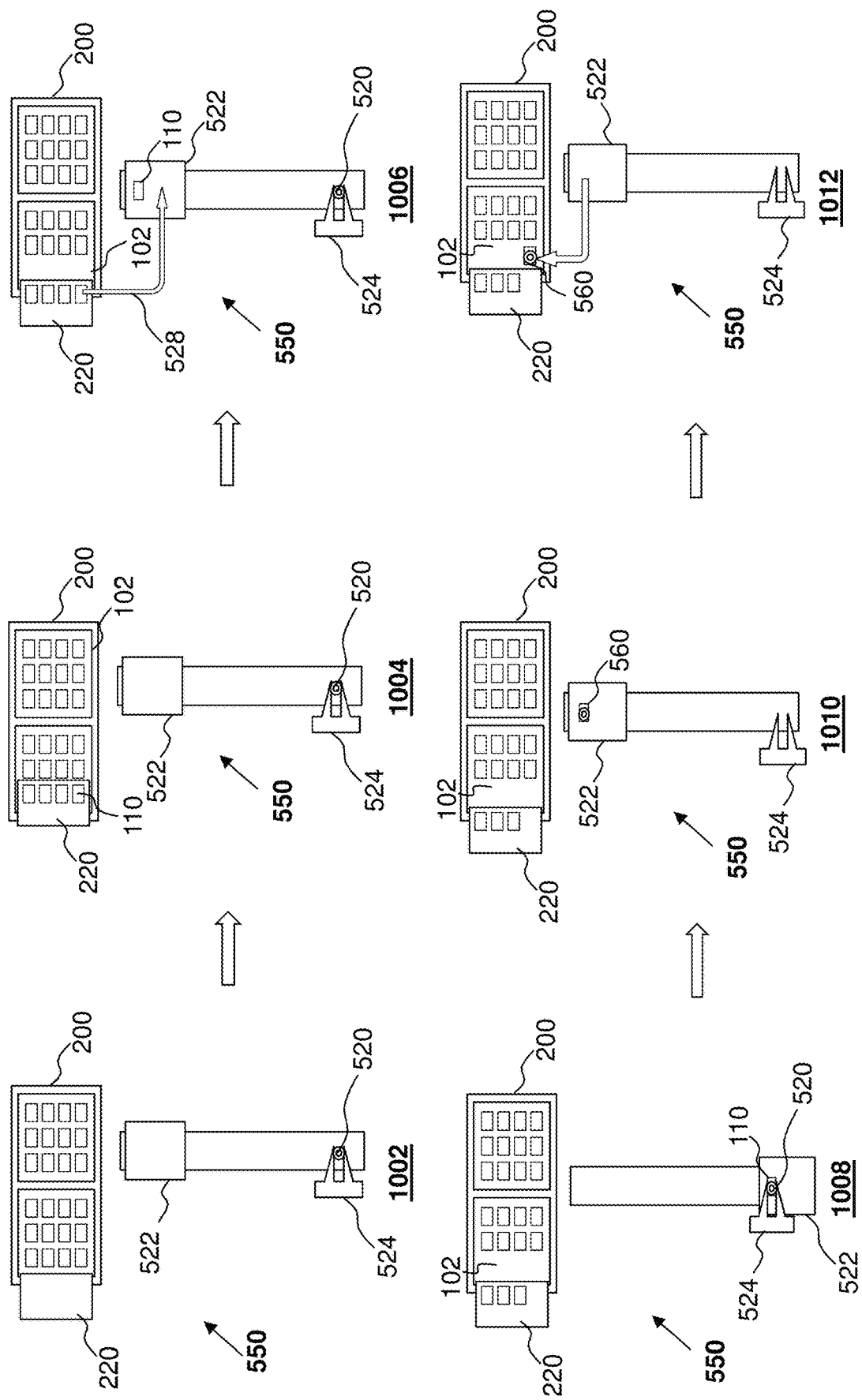
FIG. 10 contain schematic diagrams that illustrate a process flow of an optical alignment machine according to an embodiment of the present invention.

FIG. 10 contains schematic diagrams that illustrate a process flow of an optical alignment machine 550 according to an embodiment of the present invention. The optical alignment machine 550 includes the detape apparatus 200 and a processing device including an optical alignment head device 524, and a transport unit 522.

In 1002, the optical alignment head device 524 picks up a lens holder 520 including a lens.

In 1004, the detape apparatus 200 lifts up a row of electronic components 110 using the first urging element 220. The process of lifting up the row of electronic components 110, in other words, the process of detaping, is as described above in relation to FIGS. 4A to 4D. The tape carrier 102 remains intact after the detaping process. The tape carrier 102 also remains being held on the deck surface 202 of the supporting unit 210.

In 1006, the collet of the pick arm picks up a first electronic component 110 from the row of electronic components 110 held on the first urging element 220. A transport unit 522 moves to a pickup position where it can receive the electronic component 110 from the collet. The collet then transfers the first electronic component 110 to the transport unit 522, as indicated by the arrow 528.

In 1008, the optical alignment machine 550 switches on the first electronic component 110. The transport unit 522 moves the first electronic component 110 to an optical alignment position. At the optical alignment position, the first electronic component 110 carried by the transport unit 522 is aligned and assembled with the lens holder 520 held by the optical alignment head device 524, to form the processed electronic component 450 which may comprise a camera module 560.

In 1010, the transport unit 522 moves the camera module 560 back to the pickup position.

In 1012, the collet picks up the camera module 560 from the transport unit 522 at the pickup position. The collet then places the camera module 560 back onto the same tape carrier 102 from which the first electronic component 110 was removed from, while the tape carrier 102 is still being held on the support unit 210 of the detape apparatus 200.

After that, the optical alignment machine 550 repeats the processes 1006, 1008, 1010 and 1012 until all of the electronic components 110 on the first urging element 220 are assembled with respective lens holders 520 to form camera modules 560.

Next, the conveyor 240 of the detape apparatus 200 pushes the tape carrier 102 towards the first urging element 220, to repeat the process 1004 on a second row of electronic components 110 carried on the tape carrier 102. The optical alignment machine 550 can then repeat the processes 1006, 1008, 1010 and 1012 on until all of the electronic components 110 of the second row are assembled with lens holders 520 to form assembled camera modules 560.

After the optical alignment machine 550 has processed all of the electronic modules 110 carried on the tape carrier 102, it can transfer the tape carrier 102 to an output buffer or output elevator, for further downstream processes.

Various modifications may be made to the above-described embodiments.

The shape and structure of the support unit 210 need not be limited to that shown in FIG. 2B. While the support unit 210 should have an at least substantially planar deck surface 202 for supporting the tape carrier 102, the deck surface 202 need not be provided by two longitudinal bars. Further, the two longitudinal bars 212a, 212b need not be parallel to one another.

Also, while it may be preferred for the support unit 210 to have an opening 204 for the second urging element 230 to directly contact the tape carrier 102 through the opening 204, the support unit 210 may alternatively include a stretchable material in place of the opening 204, such that the second urging element 230 is able to push the tape carrier 102 out of the support plane 440.

Further, the first urging element 220 and the second urging element 230 need not be completely aligned with the opening 204, and need not be arranged about a longitudinal centreline of the support plane 440.

In addition, the conveyor 240 need not be an indexer as shown in FIG. 2B. The conveyor 240 may, for example, include a conveying belt that moves the tape carrier 102 in the conveyance direction.

The first urging element 220 may be driven by a different pivot mechanism from the above-described cam-drive pivot mechanism.

Figure 11:
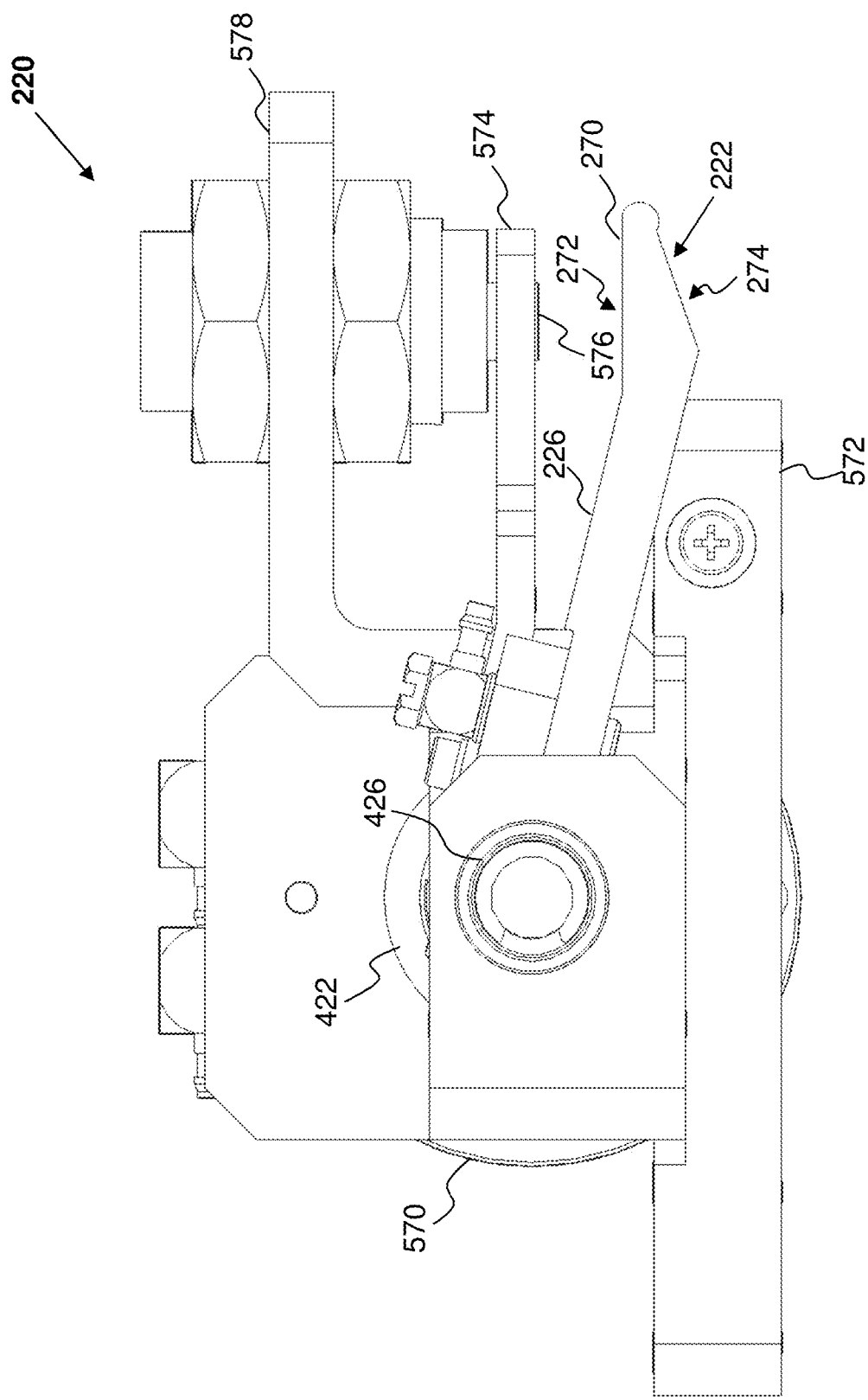
FIG. 11 shows a cross-sectional view of an alternative embodiment of the first urging element that uses a direct-drive pivot mechanism.

FIG. 11 shows a cross-sectional view of an alternative embodiment of the first urging element 220 that uses a direct-drive pivot mechanism to move the tray 222. The direct-drive pivot mechanism includes a motor 570, for example, a pneumatic rotary cylinder, configured to directly rotate the tray 222. The first urging element 220 includes a first stopper 574 that extends above the tray 222, and a second stopper 572 that extends under the tray 222. The first and second stoppers 572, 574 serve to limit a range of rotational motion of the tray 222. The first and second stoppers 572, 574 also serve to limit the motion range of the first urging element 220 in directions transverse to the support plane 440. The first stopper 574 abuts the first surface 272 of the receiving end segment 270 when the tray 222 pivots away from the support plane 440, beyond the first retracted position. The second stopper 572 abuts a bottom surface of the main body 226 facing the support plane 440, when the tray 222 pivots across the support plane 440. The first urging element 220 includes an arm member 578 above the first stopper 574 and a damper 576. The arm member 578 holds the damper 576 above the tray 222. The first stopper 574 has a through hole. The damper 576 extends through the through hole to protrude out of the first stopper 574 to face the receiving end segment 270. The damper 576 includes shock-absorbent material, to prevent unwanted vibration being imparted onto damage to electronic components 110 placed on the receiving end segment 270, when the receiving end segment 270 abuts the first stopper 574.

Alternatively, the receiving end segment 270 need not pivot to move between the first retracted position and the first detape position. The receiving end segment 270 or the first urging element 220 may instead, linearly displace towards and away from the support plane.

Depending on the movement mechanism of the first urging element 220, the first urging element 220 may not necessarily move along the deck surface 202 in the longitudinal direction. Consequently, the guide tracks 218 may not be required on the deck surface 202.

Also, the detape apparatus 200 may include a drive unit to move the first urging element 220 and/or the second urging element 230, to position the first urging element 220 and the second urging element 230 adjacent to one another along the support plane 440 during a detape process. The drive unit may be the actuator 206.

In addition, although the tray 222 is described as having a main body 226 inclined relative to the receiving end segment 270, it is also possible for the tray 222 to consist of only a single planar body.

Also, while it may be preferable for the first urging element 220 to include the vacuum inlet 228 and suction holes 262, the vacuum inlet 228 and the suction holes 262 are not essential as the receiving end segment 270 may still be able to retain the electronic component 110 when moving to the first retracted position where the first surface of the receiving end segment 270 is parallel to the support plane 440.

Further, the second urging element 230 need not include the rollers 232. While the rollers 232 are useful for reducing friction between the second urging element 230 and the tape carrier 102, it is not necessary for serving the function of separating the electronic component 110 from the tape carrier 102. The rollers 232 may be replaced by smooth curved or convex members, that may similarly minimize friction between the second urging element 230 and the tape carrier 102.

Further, while the detape apparatus 200 is described above as having the first urging element 220 and the second urging element 230 configured to move in opposite directions towards the support plane 440, the directions need not be exactly opposite and/or may not be perfectly straight. Also, these directions need not be normal to the support plane 440, as long as they each have a directional component that is normal to the support plane 440.

Also, the detape apparatus 200 need not include the collet 706. The detape apparatus 200 may work with collets or pick arms from a separate device. Further, the collet 706 need not include the clamper 704.

The invention described herein is susceptible to variations, modifications and/or additions other than those specifically described and it is to be understood that the invention includes all such variations, modifications and/or additions which fall within the spirit and scope of the above description.

The invention claimed is:

1. A detape apparatus for removing electronic components from a tape carrier, the detape apparatus comprising:
   a support unit having a deck surface for supporting the tape carrier, the deck surface defining a support plane on which the tape carrier is supportable;
   a first urging element comprising a receiving segment which is movable relative to the support plane between a first retracted position spaced from the tape carrier and a first detape position next to a first side of the tape carrier, the receiving segment being pivotable about a pivot axis that is substantially perpendicular to a conveyance direction of the tape carrier for moving the receiving segment between the first retracted position and the first detape position;
   a second urging element comprising a movable member which is movable relative to the support plane between a second retracted position spaced from the tape carrier and a second detape position abutting a second side of the tape carrier opposite to the first side; and
   a conveyor configured to move the tape carrier carrying the electronic components in the conveyance direction along the deck surface;
   wherein during a detape process, the second urging element is operative to move to the second detape position to thereby push the tape carrier out of the support plane to separate at least one of the electronic components from the tape carrier, while the receiving segment is operative to move to the first detape position to receive the at least one of the electronic components which is thus separated from the tape carrier.

2. The detape apparatus of claim 1, wherein the first detape position is adjacent to the second detape position such that the at least one electronic component is slidable onto the receiving segment when it is separated from the tape carrier by the second urging element.

3. The detape apparatus of claim 1, wherein the second urging element travels in directions that are substantially normal to the support plane when the second urging element moves between the second retracted position and the second detape position.

4. The detape apparatus of claim 1, wherein the first urging element and the second urging element are located on opposite sides of the support unit.

5. The detape apparatus of claim 1, wherein the receiving segment has a first surface that faces away from the support plane, the first surface being inclined relative to the support plane when the receiving segment is moved to the first detape position.

6. The detape apparatus of claim 5, wherein, when the receiving segment is moved to the first retracted position, the first surface is substantially parallel to the support plane, for the at least one of the electronic components which is separated from the tape carrier to be picked up by a collet.

7. The detape apparatus of claim 1, wherein the receiving segment has a second surface that faces the support plane, the second surface being configured to be substantially parallel to the support plane when the receiving segment is at the first detape position.

8. The detape apparatus of claim 1, wherein the receiving segment is connected to a main body, and the first urging element further comprises:
   an actuator operative to move the first urging element along the deck surface; and
   a cam follower coupled to the deck surface, wherein the main body is biased against the cam follower in a direction towards the support plane.

9. The detape apparatus of claim 8, wherein the actuator is operative to drive the first urging element to move linearly along the deck surface relative to the cam follower to cause rotation of the main body and the receiving segment.

10. The detape apparatus of claim 1, further comprising a motor configured to rotate the receiving segment, and a pair of stoppers located above and below the receiving segment respectively for limiting a range of pivotal motion of the receiving segment.

11. The detape apparatus of claim 1, wherein the receiving segment further comprises at least one suction hole configured to generate a suction force to retain the at least one of the electronic components which is separated from the tape carrier on the receiving segment.

12. The detape apparatus of claim 1, wherein the support unit further comprises an opening such that the deck surface supports the tape carrier across the opening when the detape apparatus is in use, and the first urging element and the second urging element are aligned with the opening on opposite sides of the opening.

13. The detape apparatus of claim 12, wherein the second urging element is extendable through the opening for abutting the tape carrier.

14. The detape apparatus of claim 1, wherein the second urging element comprises at least one roller having a rotational axis that is substantially perpendicular to the conveyance direction.

15. The detape apparatus of claim 1, further comprising a drive unit configured to move at least one of the first urging element and second urging element relative to the other along the support plane.

16. The detape apparatus of claim 1, further comprising a collet configured to pick up the at least one of the electronic components which is separated from the tape carrier from the receiving segment, wherein the collet includes a damper shaped to push against a part of the at least one of the electronic components for straightening the separated electronic component.

* * * * *